United States Patent [19]
Jang et al.

[11] Patent Number: 5,740,065
[45] Date of Patent: Apr. 14, 1998

[54] METHOD FOR MANUFACTURING SEMICONDUCTOR DEVICE

[75] Inventors: Young-Chul Jang, Suwon; Hyo-Seok Choi, Seoul; Dong-Heui Jang; Sun-Yong Lee, both of Suwon, all of Rep. of Korea

[73] Assignee: Samsung Electronics Co., Ltd., Suwon, Rep. of Korea

[21] Appl. No.: 449,853

[22] Filed: May 24, 1995

[30] Foreign Application Priority Data

May 25, 1994 [KR] Rep. of Korea ............... 11408/1994

[51] Int. Cl.$^6$ ............... H01L 21/68; G01B 11/26; G06F 17/18
[52] U.S. Cl. ............ 364/488; 364/491; 364/551.01; 364/554; 364/575; 364/468.15; 364/468.21; 364/468.28; 437/8; 355/53
[58] Field of Search ............... 364/552, 468, 364/490, 559, 488, 491, 578, 571.01–571.05, 551.01–555, 468.01, 468.28, 575; 250/548, 491.2–492.22; 355/53, 43; 356/401; 430/30; 437/8

[56] References Cited

U.S. PATENT DOCUMENTS

| 4,627,010 | 12/1986 | Kosugi | 364/559 |
| 4,780,617 | 10/1988 | Umatate et al. | 250/548 |
| 4,910,679 | 3/1990 | Takahashi et al. | 364/490 |
| 4,958,160 | 9/1990 | Ito et al. | 355/53 |
| 5,243,377 | 9/1993 | Umatate et al. | 355/53 |

*Primary Examiner*—Kevin J. Teska
*Assistant Examiner*—Phallaka Kik
*Attorney, Agent, or Firm*—Cushman Darby & Cushman IP Group of Pillsbury Madison & Sutro LLP

[57] ABSTRACT

A method for manufacturing a semiconductor device comprises the steps of extracting an optimal working condition by accumulatively averaging accumulated working conditions of lots previously performed in an expectation process to be currently performed in the manufacturing equipment, extracting a correction condition by extracting information for an alignment state of a lower layer performed by the expectation process, and setting the working condition by adding the correction condition to the optimal working condition.

12 Claims, 3 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device, and more particularly to a manufacturing method capable of automatically setting a working condition in a manufacturing process performed by lots.

2. Description of the Related Art

In general, when a number of semiconductor devices are serially manufactured on a semiconductor substrate, e.g., a silicon wafer, there generally is performed a process of integrating semiconductor elements on the semiconductor substrate by repeating a thin film forming process, a photoresist layer pattern forming process and an etching process. Further, when performing the above processes, a unit process is performed with twenty-five sheets of wafers to fifty sheets of wafer constituting a unit lot. The photoresist layer pattern forming process and the etching process, among the unit processes performed by lot, are especially sensitive to variations in a working condition. Further, the two processes include a sampling process for a lot sample, i.e., one or two sheets of wafers, before starting the process for the whole lot. According to a result of the sampling process, a process variable is reset before performing a main process for the whole lot. Such a method is widely used in manufacturing semiconductor devices.

In the following description of prior art processes including the sampling process, for convenience sake, only the photoresist layer pattern forming process will be explained. When a process object for one lot is received, one or two sheets of sample wafers from among the received process objects are selected. The selected sample wafers undergo a photoresist layer coating process, a wafer alignment & exposure process, and a development process to thereby complete the sampling process. According to the result of the sampling process, i.e., after checking the alignment state of a pattern and measuring a Critical Dimension (CD), the optimal working condition is extracted. Further, the process variables are reset to be suitable for the extracted condition and the photoresist layer pattern forming process for the whole lot is performed by the set working condition. Such a sampling process is widely used for etching processes such as Chemical Vapor Deposition (CVD), as well as in photo processes. For example, in the etching process, one or two sheets of wafers are selected as a sample and etched to thereby check whether or not an etching condition is appropriate by inspecting an etching profile, measuring the thickness of a remaining layer, or measuring the CD. In accordance with the check result, the process variables (etching time, etching activation energy, and so on) adjusted and the main process is thus performed.

However, with the sampling process described above, there arise the following problems. First, due to the time required for the sampling process, the overall process time requirement time must be increased, thereby increasing a Turn Around Time (TAT) for a product to be finally completed through each layer forming and photoetching process. Additionally, when the sampling process must be again performed due to defects generated therein, the above problem becomes even more serious.

Moreover, the accuracy of the performance of the sampling process and the reset of the working condition depend upon how well a worker handles the equipment. If the working condition is incorrectly set due to measurement error or mistake by an individual worker, the defect is generated in the wafer of the whole lot manufactured by the same serial process. Thereby, the sampling process may be again performed or the whole lot may be affected.

Furthermore, if the result of the sampling process is arbitrarily checked and estimated by the worker or if the performance of the sampling process is not confirmed owing to a worker's mistake or neglect, it is difficult to insure the reproducibility of the process, thereby lowering the reliability of its products.

SUMMARY OF THE INVENTION

It is therefore object of the present invention to provide a method for manufacturing a semiconductor device which can directly perform a fabrication process without requiring a sampling process.

It is the other object of the present invention to provide a method for manufacturing a semiconductor device capable of improving productivity by reducing the process time required for manufacturing products.

It is another object of the present invention to provide a method for manufacturing a semiconductor device in which reliability is excellent because of the improvements in reproduction of the process.

It is a further object of the present invention to provide a method for manufacturing a semiconductor device capable of improving productivity by reducing working time of manufacturing equipment required for a sampling process.

The present invention having the above objects comprises the steps of extracting an optimal working condition by accumulatively averaging accumulated working conditions of lots previously performed in an expectation process to be currently performed in the manufacturing equipment, extracting a correction condition by extracting information for the alignment state of a lower layer performed by the expectation process, and setting the working condition by adding the correction condition to the optimal working condition.

BRIEF DESCRIPTION OF THE DRAWINGS

The above and other objects, advantages and features of the present invention will be more apparent from the following detailed description taken with the attached drawings in which.

DETAILED DESCRIPTION OF THE PREFERRED EMBODIMENT

Figure 1:
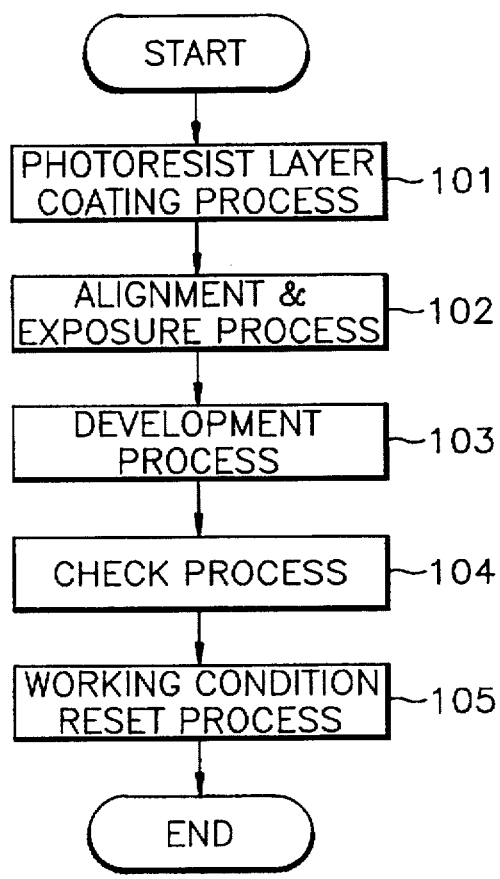
FIG. 1 is a flow chart showing the order of a photoresist layer pattern forming process according to the present invention.

FIG. 1 is a flow chart showing the order of a photoresistor layer pattern forming process according to an embodiment of the present invention. Referring to FIG. 1, when the lot for which the process is to be performed is inputted, a photoresist layer coating process 101 for all wafers in the lot is performed in a photoresist layer spread device. After the photoresist layer coating process, an alignment & exposure process 102 for the whole lot is performed for each wafer in the alignment & exposure device. At this point, as mentioned below, a working condition is set by a program stored in the alignment & exposure device during the alignment & exposure process according to the present invention, thereby permitting the alignment & exposure process for the whole lot to be performed without a sampling process. After completion of the alignment & exposure process, a process 103 for developing the photoresist layer exposed by the alignment & exposure process is performed and the photoresist layer pattern is thus formed on the wafer. After the completion of the development process, a process 104 for checking whether or not the photoresist layer pattern is formed as intended, is performed. Further, after the completion of all the above processes, a working condition reset process 105 is performed to apply changes to the working condition of the alignment & exposure device. The working condition reset process is performed through a corresponding set of parameter values. At this time, the parameters to be set are elements such as exposure time, focus offset, spatial shifts X and Y, X-Y scaling, wafer rotation, orthogonality, and so on, i.e., the elements affecting the alignment & exposure process of the wafer.

The calculation of an optimal value for each parameter is performed as follows.

1) The production of a parameter value related to an exposure condition

The optimal condition of parameter values necessary for exposure are obtained by adding together the parameters for lots within a standard deviation of ±1σ(67.5%) from a reference value set in advance after processing previous lots using the previous same process, thereby setting the optimal condition of the current process. The parameter value of the current process is determined by the following equation (1).

$$Xtn = \frac{1}{n-1} \sum_{i=1}^{n-1} (Xti \pm \mathscr{E}) \quad (1)$$

(n is a natural number of over 1)

In the above equation (1), the $\mathscr{E}$ term indicates a correction element obtained by subtracting an objective value from a resultant value. The (Xti-$\mathscr{E}$) term indicates a correction value including error generated in the process. If a process is performed with the correction value applied, the process can be performed without error. Therefore, the parameter value Xtn of the n-th process is determined by accumulatively averaging the parameter values Xti±$\mathscr{E}$(i=1~n−1), as corrected by the normal (n−1) processes which had been previously performed, the normal processes being those which have values within the standard deviation.

2) The production of the parameter value related to alignment

In the photoresist layer pattern forming process, the alignment operation is performed on the basis of an alignment key formed in a lower layer or a reference layer during the manufacturing process of the semiconductor device. Further, since an alignment state of the alignment key in the process previously performed affects that of the current process, the error for the existing alignment state should be used in the alignment of the current process. Accordingly, it is necessary to add the error to the parameter in accordance with the wafer alignment of the current process. That is, as seen in the following equation (2), an alignment parameter of the current process is obtained by adding to the error a value multiplied by a gain determined according to the amount of correlation between each layer.

$$Axy'=Axy+(E \times G) \quad (2)$$

In the above equation (2), the alignment parameter Axy' of the current process is determined by adding the alignment parameter Axy to a multiplied value (E×G). The gain has the value of 0.00~1.00 and indicates the correlation between the reference layer and the layer expected to be currently performed.

After the parameter values according to the alignment & exposure process are determined depending upon the above equations (1) and (2), the values are inputted to the alignment & exposure device and used as the optimal conditions of the alignment & exposure process to be currently performed.

Figure 2:
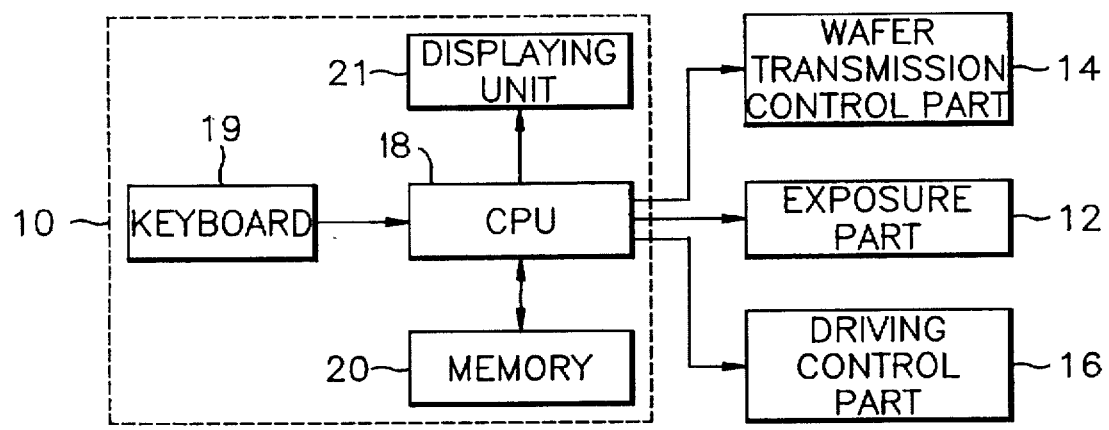
FIG. 2 is a block diagram of an alignment & exposure device used in a photoresist layer pattern forming process of the present invention.

FIG. 2 is a block diagram view of the alignment & exposure device used in the photoresist layer pattern forming process of the present invention. Referring to FIG. 2, the alignment & exposure device comprises a host computer 10 for controlling operation of each part, an exposure part 12 for performing the alignment & exposure operation by the loading of the wafer, a wafer transmission control part 14 for controlling the transmission and alignment of the wafer in the alignment & exposure device, and a driving control part 16 for controlling the operation according to exposure of the exposure part 12. The host computer 10 has a central processing unit CPU 18 for controlling the operation of each part, a keyboard 19 for inputting a control command and various kinds of data to the CPU 18, a memory 20 for storing programs to control the CPU 18 and also storing the data inputted from the CPU 18, and a monitor 21 for displaying data outputted from the CPU 18.

Figure 3:
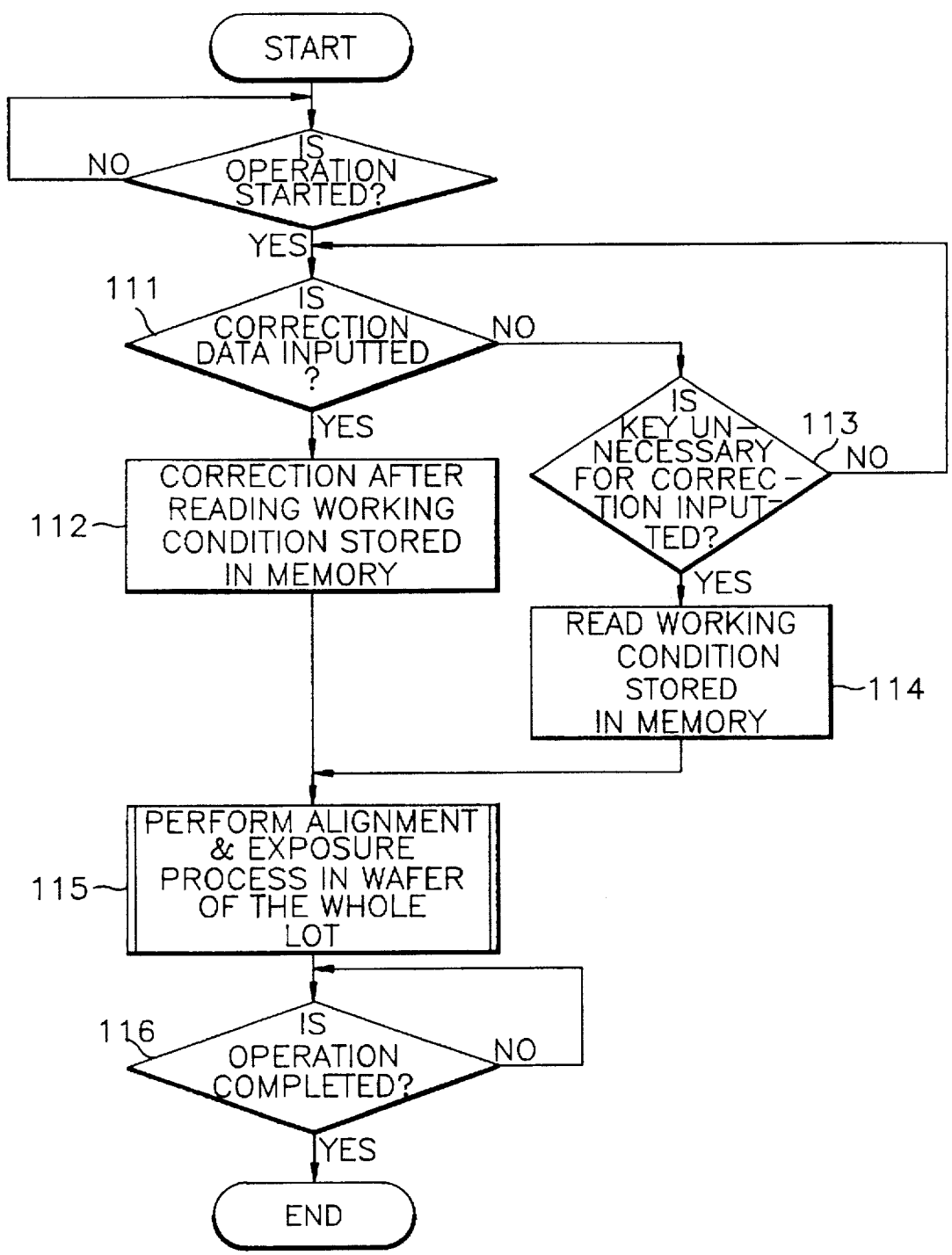
FIG. 3 is a flow chart showing the control order of an alignment & exposure device for performing an alignment & exposure process according to the present invention.

FIG. 3 is a flow chart showing a control order of the alignment & exposure device for performing the alignment & exposure process according to the present invention. In one embodiment of the present invention, the working condition is stored in the memory of the alignment & exposure device to thus permit the CPU of the alignment & exposure device to control the operation of each part.

As shown in FIG. 3, the alignment & exposure process performed by the alignment & exposure device of FIG. 2 is as follows. If a process starting signal is inputted from the keyboard 19, the CPU 18 of the alignment & exposure device performs a step 111 of detecting whether or not correction data is inputted through the keyboard 19. The correction data to be used for compensating errors in the alignment state of the lower layer, is calculated according to the above equation (2). If the correction data is inputted from the keyboard 19, the CPU 18 reads the working condition stored in the memory 20 and then performs a step 112 of setting a new working condition by correcting the working condition read from the memory 20 on the basis of the correction data. However, if the correction data is not inputted from the keyboard 19 in step 111 above, the CPU 18 performs a step 113 of detecting whether or not a signal is inputted from the keyboard 19, the signal informing that there is no need to perform the correction operation. If the information signal is inputted, the CPU 18 reads the working condition stored in the memory and performs a step 114 of setting the read working condition as that of the alignment & exposure process to be currently performed. Thereafter, the CPU 18 controls the exposure part 12, the wafer transmission control part 14, and the driving control part 16 according to the working condition set in the above step 112 or 114 to thereby have a step 115 of serially performing the alignment & exposure operation with respect to wafers in the whole lot. The control operation of each part through the CPU 18 after the determination of the working condition is the same as that of the prior art. In step 115 the CPU 18 performs a step 116 of detecting whether or not the alignment & exposure process for the object lot is completed. According to the result of the detection, if the process is completed, the CPU 18 finishes the operation by controlling the operation of each part to thereby enter an operation mode.

As mentioned above with reference to FIG. 1, when the alignment & exposure operation for the whole lot is completed in the alignment & exposure device through the above steps, the process in step 104 of detecting whether the photoresist layer pattern is formed according to a predetermined setting condition after the development process, is performed. After completing detection process, a step 105 of storing data in the memory 20, through the keyboard 19, for example, is performed in the alignment & exposure device, the data being used for resetting the working condition of the next process.

Figure 4:
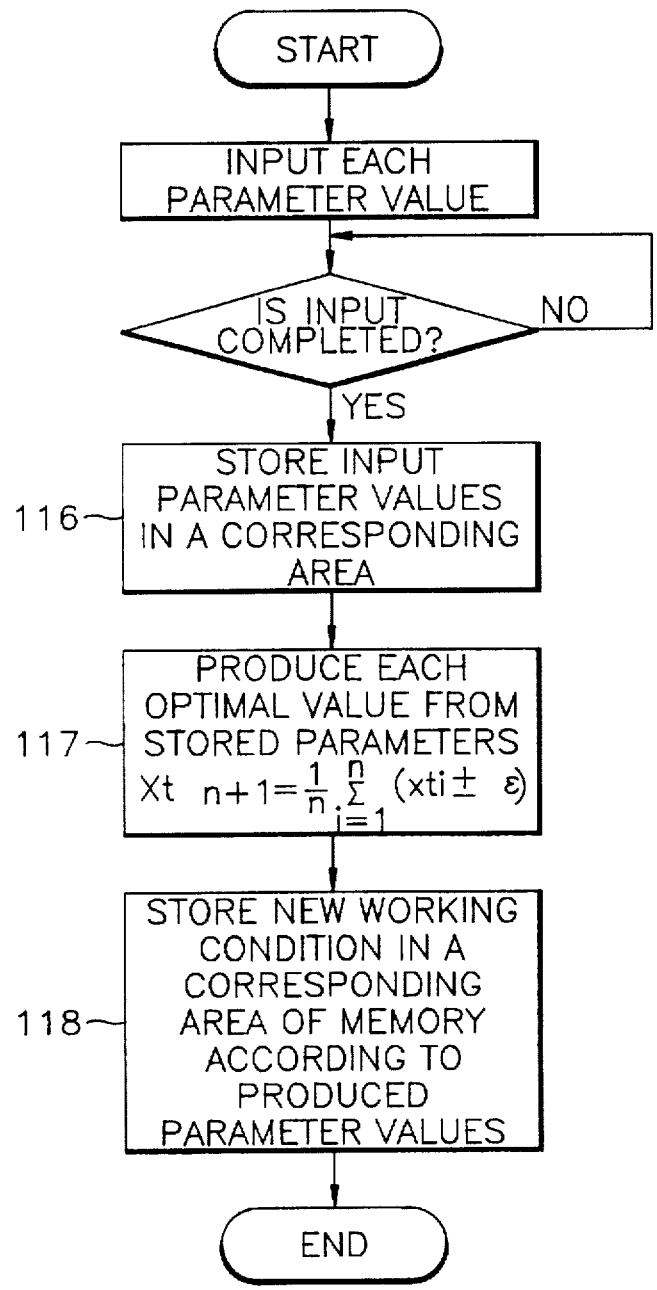
FIG. 4 is a flow chart showing a data input step for resetting a working condition.

FIG. 4 is a flow chart showing a step of inputting data for resetting the working condition. With respect to FIG. 4, a step of resetting the working condition in the alignment & exposure device shown in FIG. 2 is as follows. If a control signal to indicate a working condition reset mode is inputted through the keyboard, the CPU 18 performs a step of storing each parameter value inputted through the keyboard 19 in the corresponding area of the memory 20, (i.e. an area in which the parameters of processes previously performed are stored). At this time, the input parameter values are of the exposure process. Further, the input parameter values include real data values having errors generated according to the result of the exposure process and the data for correcting the error. Furthermore, the input parameter values may have the already completed correction. The CPU 18 reads the various kinds of parameter values stored in the memory 20 to thereby perform a step 117 of producing the optimal value for each parameter from the read value. Thereby, an optimal parameter value is obtained from the parameters of the processes previously performed as well as the process just performed, the optimal value being used in the next process. Thereafter, the CPU 18 sets a new working condition according to the optimal value for each parameter produced in step 117 above to thereby perform a step of storing the new working condition in the corresponding area of the memory 20, i.e., an area in which the previous working condition is stored, by over-writing the set working condition. After the completion of the storage step, the CPU 18 finishes all the operations and enters the operation standby mode.

When the parameters are added for processing using the same equipment, it is possible to set more precise optimal parameters. Thereby, it is also possible to minimize errors generated in the alignment & exposure process.

As discussed in the foregoing description, in the present invention, the correction for errors generated in previous processes is taken into account to thus set a new working condition in the interior thereof. Thereby, it is possible to manufacture semiconductor devices using only a main process without the need for a sampling process. Therefore, the manufacturing method according to the present invention improves reliability for product reliability as well as productivity in accordance with the reduction of production time.

What is claimed is:

1. A method for manufacturing a semiconductor device with manufacturing equipment performing a process having a working condition, said manufacturing equipment being adapted to manufacture said semiconductor device in units of lots, said method comprising the steps of:

extracting an optimal working condition by accumulatively averaging working conditions of lots previously processed using said process performed by said manufacturing equipment;

extracting a correction condition by extracting information corresponding to an alignment state of said process;

setting a current working condition by adding said correction condition to said optimal working condition; and performing said process for an entire lot according to said current working condition.

2. A method for manufacturing a semiconductor device as claimed in claim 1, wherein said working condition includes process parameter values, and wherein said step of extracting said optimal working condition includes respectively averaging each of said process parameter values of said working conditions of said previously processed lots.

3. A method for manufacturing a semiconductor device as claimed in claim 2, further comprising a step of detecting a resultant value of performing said process according to said current working condition, and wherein said step of extracting said optimal working condition includes accumulatively averaging working conditions set for selected ones of said previously processed lots, each having a corresponding resultant value differing from a reference value by no more than a standard deviation.

4. A method according to claim 1, wherein said working condition includes process parameter values and alignment parameter values and wherein said step of setting said current working condition includes adding said correction condition to said alignment parameter values of said optimal working condition.

5. A method according to claim 4, wherein said process is a photoresist alignment and exposure process, and wherein said process parameter values include at least one of an exposure time, a focus offset, an X-Y spatial shift, an X-Y scaling, a wafer rotation, and an orthogonality factor.

6. A method according to claim 1, wherein said step of extracting said correction condition includes multiplying a correction value by a gain whose value is determined according to an amount of correlation between lots.

7. A method according to claim 1, further comprising the steps of:

detecting a resultant value of performing said process according to said current working condition; and resetting said current working condition in accordance with said resultant value.

8. A method for manufacturing a semiconductor device with manufacturing equipment performing a process having a working condition, said manufacturing equipment being adapted to manufacture said semiconductor device in units of lots, said method comprising the steps of:

extracting an optimal working condition by accumulatively averaging working conditions of lots previously processed using said process performed by said manufacturing equipment;

setting a current working condition based on said optimal working condition;

performing said process for an entire lot according to said current working condition;

detecting a resultant value of performing said process according to said current working condition; and resetting said current working condition in accordance with said resultant value.

9. A method according to claim 8, further comprising a step of extracting a correction condition by extracting information corresponding to an alignment state of said process.

10. A method according to claim 9, wherein said working condition includes process parameter values and alignment parameter values and wherein said step of setting said current working condition includes adding said correction condition to said alignment parameter values of said optimal working condition.

11. A method according to claim 8, wherein said working condition includes process parameter values, and wherein said step of extracting said optimal working condition includes respectively averaging each of said process parameter values of said current working conditions set for said previously processed lots.

12. A method according to claim 8, wherein said step of extracting said optimal working condition includes accumulatively averaging working conditions set for selected ones of said previously processed lots for which said resultant value is within a standard deviation.

* * * * *